United States Patent
Tamai

(10) Patent No.: US 6,990,641 B2
(45) Date of Patent: Jan. 24, 2006

(54) INTEGRATED CIRCUIT DESIGN SYSTEM AND METHOD USING PREPROCESSOR WHICH CHANGES HARDWARE DESCRIPTION IN ACCORDANCE WITH CONFIGURATION

(75) Inventor: Takanori Tamai, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 224 days.

(21) Appl. No.: 10/602,618

(22) Filed: Jun. 25, 2003

(65) Prior Publication Data

US 2004/0194038 A1  Sep. 30, 2004

(30) Foreign Application Priority Data

Mar. 31, 2003  (JP) .............................. 2003-096687

(51) Int. Cl.
G06F 17/50 (2006.01)

(52) U.S. Cl. ........................................ 716/3
(58) Field of Classification Search ............... 716/3, 716/4, 18
See application file for complete search history.

(56) References Cited

U.S. PATENT DOCUMENTS 5,987,239 A  11/1999  Kirsch 6,658,630 B1 * 12/2003  Threatt et al. ............... 716/3
6,836,877 B1 * 12/2004  Dupenloup .................. 716/18

FOREIGN PATENT DOCUMENTS

WO   WO 02/084538 A1   10/2002

OTHER PUBLICATIONS

Marcus Bluemi, et al., "A Workbench for Generation of Component Models", 0-8186-4350-1/93, 1993 IEEE, 1993, pp. 466-471.
Mark G. Arnold, et al., "A Synthesis Preprocessor that Converts Implicit Style Verilog Into One-Hot Designs", IEEE, Verilog HDL Conference, Mar. 31, 1997, pp. 38-45.

* cited by examiner

Primary Examiner—Stacy A. Whitmore
(74) Attorney, Agent, or Firm—Oblon, Spivak, McClelland, Maier & Neustadt, P.C.

(57) ABSTRACT

A preprocessor processes a first circuit description file containing a first hardware description language and a second hardware description language on the basis of a preprocessor control file. The preprocessor converts at least a portion described by the first hardware description language in the first circuit description file into the second hardware description language to create and output a second circuit description file.

19 Claims, 13 Drawing Sheets

INTEGRATED CIRCUIT DESIGN SYSTEM AND METHOD USING PREPROCESSOR WHICH CHANGES HARDWARE DESCRIPTION IN ACCORDANCE WITH CONFIGURATION

CROSS-REFERENCE TO RELATED APPLICATIONS

This application is based upon and claims the benefit of priority from the prior Japanese Patent Application No. 2003-096687, filed Mar. 31, 2003, the entire contents of which are incorporated herein by reference.

BACKGROUND OF THE INVENTION

1. Field of the Invention

The present invention relates to a preprocessor which is used to automate operation of changing a hardware description in accordance with a configuration. The present invention also relates to an integrated circuit design system using the preprocessor and an integrated circuit design method by the system. The present invention is particularly suitable for a system which automatically creates IP and software IP in accordance with user's designation, which creates a circuit description file which can designate synchronous/asynchronous reset of a flip-flop or change the cluster combination of a gated clock.

2. Description of the Related Art

Conventionally, an integrated circuit design system is designed to have an arrangement as shown in FIG. 1. A computer system used to design such an integrated circuit and a method thereof are described in, e.g., U.S. Pat. No. 5,987,239 issued to Graham Kirsch, "COMPUTER SYSTEM AND METHOD FOR BUILDING A HARDWARE DESCRIPTION LANGUAGE REPRESENTATION OF CONTROL LOGIC FOR A COMPLEX DIGITAL SYSTEM", Nov. 16, 1999.

A circuit description file 11 which is described by a user using an existing language (Verilog-HDL: Verilog-Hardware Description Language or VHDL: Very high speed integrated circuits Hardware Description Language) and a logic synthesis control script file 12 (script file which controls a logic synthesis program) are logically synthesized by a logic synthesis program 14 of a processor (logic synthesis tool or computer) 13. The logic synthesis program 14 executes processing for converting the circuit description file 11 into a circuit description file using a "cell" serving as a basic unit of a circuit to create a netlist 15. The netlist 15 is processed by a layout wiring program (a program which lays out cells and wirings) 16 to determine the layout of the cells and wirings so that the circuit of a chip (semiconductor integrated circuit) 17 is designed.

In the above conventional integrated circuit design system, to describe a synchronous reset circuit or asynchronous reset circuit using an existing language such as Verilog-HDL or VHDL, two descriptions for synchronous reset and asynchronous reset must be manually generated. In addition, when a flip-flop should be changed to a gated clock to reduce power consumption, the optimum cluster design method changes because conditions such as the optimum number of flip-flops to be put into one cluster and flip-flops that are laid out close to each other in a chip and should therefore be cluster-combined change depending on various factors. Examples of factors are:

(1) The difference in physical technology of a semiconductor integrated circuit (IC or LSI).

(2) The difference in circuit operation pattern, i.e., the manner a user application uses the circuit.

(3) The layout of circuits in a chip.

However, convergence to the optimum value is conventionally difficult because descriptions for synchronous reset and asynchronous reset are manually generated, or a circuit for forming a gated clock is inserted by trial and error. In addition, to insert a circuit to form a gated clock, peripheral circuits must be corrected. If the circuit scale is large, the number of correction portions may be as large as several hundreds, although the correction concerns only the periphery of the description of the flip-flop. Furthermore, bugs are unavoidable in manual correction. Hence, function verification operation is necessary every time a circuit is corrected. The circuit scale and complexity of LSIs are rapidly increasing. Accordingly, the time required for verification operation also becomes long. This partly prolongs the LSI development period or increases the cost.

A tool which automatically inserts a circuit for gated clock formation already exists (e.g., Marcus Blüml et al., "A Workbench for Generation of Component Models", 0-8186-4350-1/93 1993 IEEE, pp. 466–471). However, this tool cannot meet a particular requirement to, e.g., combine designated clusters and is not necessarily satisfactory.

BRIEF SUMMARY OF THE INVENTION

According to an aspect of the present invention, there is provided a preprocessor which processes a first circuit description file containing a first hardware description language and a second hardware description language on the basis of a preprocessor control file, and converts at least a portion described by the first hardware description language in the first circuit description file into the second hardware description language to create and output a second circuit description file.

According to another aspect of the present invention, there is provided an integrated circuit design system comprising a preprocessor which processes a first circuit description file containing a description of a flip-flop described by a first hardware description language on the basis of a preprocessor control file, creates a second circuit description file by converting at least the description of the flip-flop into a second hardware description language, and creates a logic synthesis control script file for a gated clock circuit, and a logic synthesis tool which subjects the second circuit description file logical synthesizes using logic synthesis control script file created by the preprocessor and converts the files into a circuit description file using a cell as a basic unit of a circuit to create a netlist and determines a layout of cells and wirings in an integrated circuit on the basis of the netlist.

According to still another aspect of the present invention, there is provided an integrated circuit design method, comprising steps of inputting, to a preprocessor, a circuit description file containing a first hardware description language and a second hardware description language and a preprocessor control file which controls operation of the preprocessor and converting at least a portion described by the first hardware description language in the circuit description file into the second hardware description language, logically synthesizing a circuit description file output from the preprocessor using a logic synthesis control script file for a gated clock circuit and a logic synthesis control script file for circuits other than the gated clock circuit by a logic synthesis tool to convert the files into a circuit description file using a cell as a basic unit of a circuit and create a netlist, and determining the layout of the cells and wirings on the basis of the netlist to design a circuit of a chip.

DETAILED DESCRIPTION OF THE INVENTION

Figure 1:
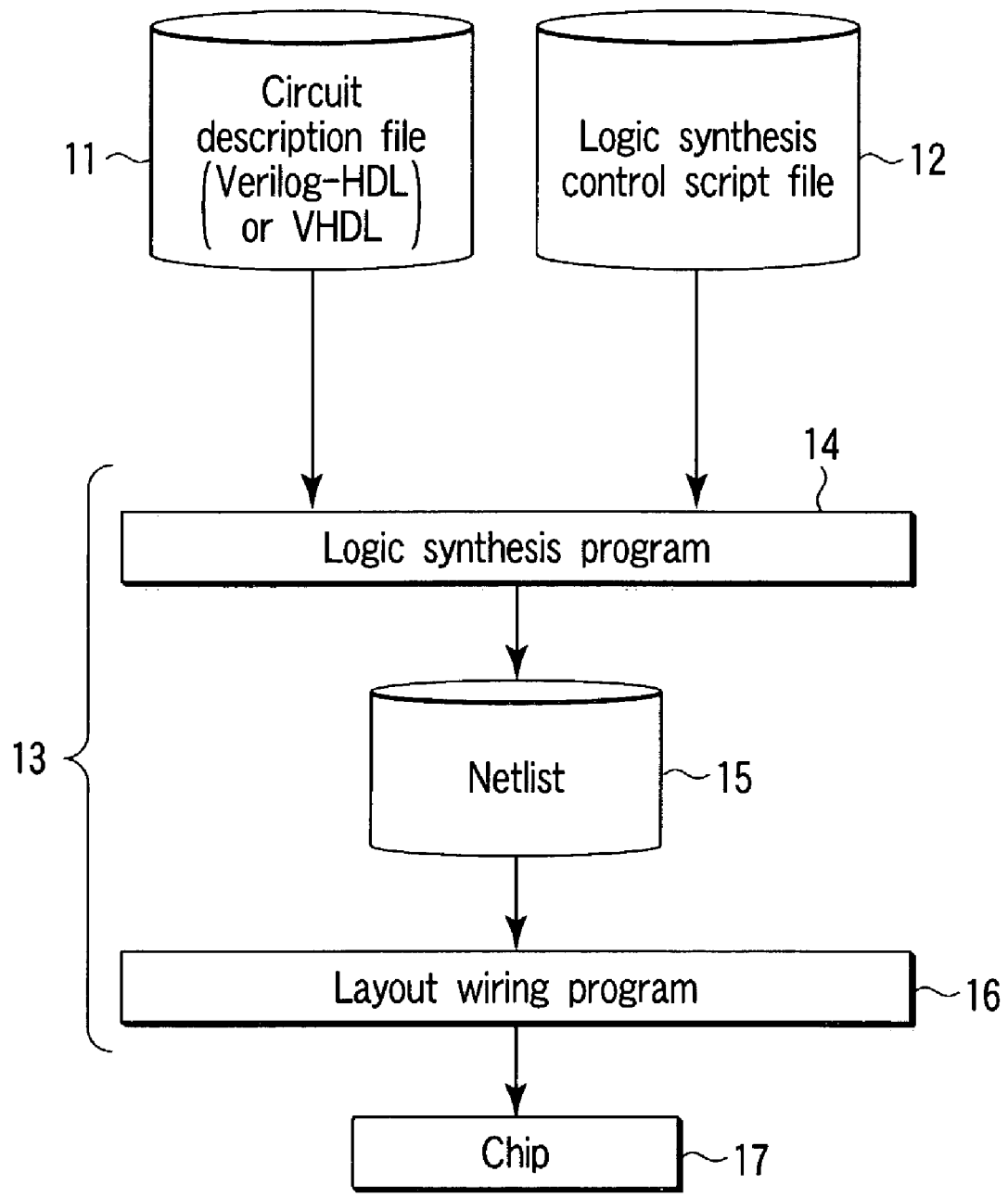
FIG. 1 is a functional block diagram for explaining a conventional integrated circuit design system and integrated circuit design method.
Figure 2:
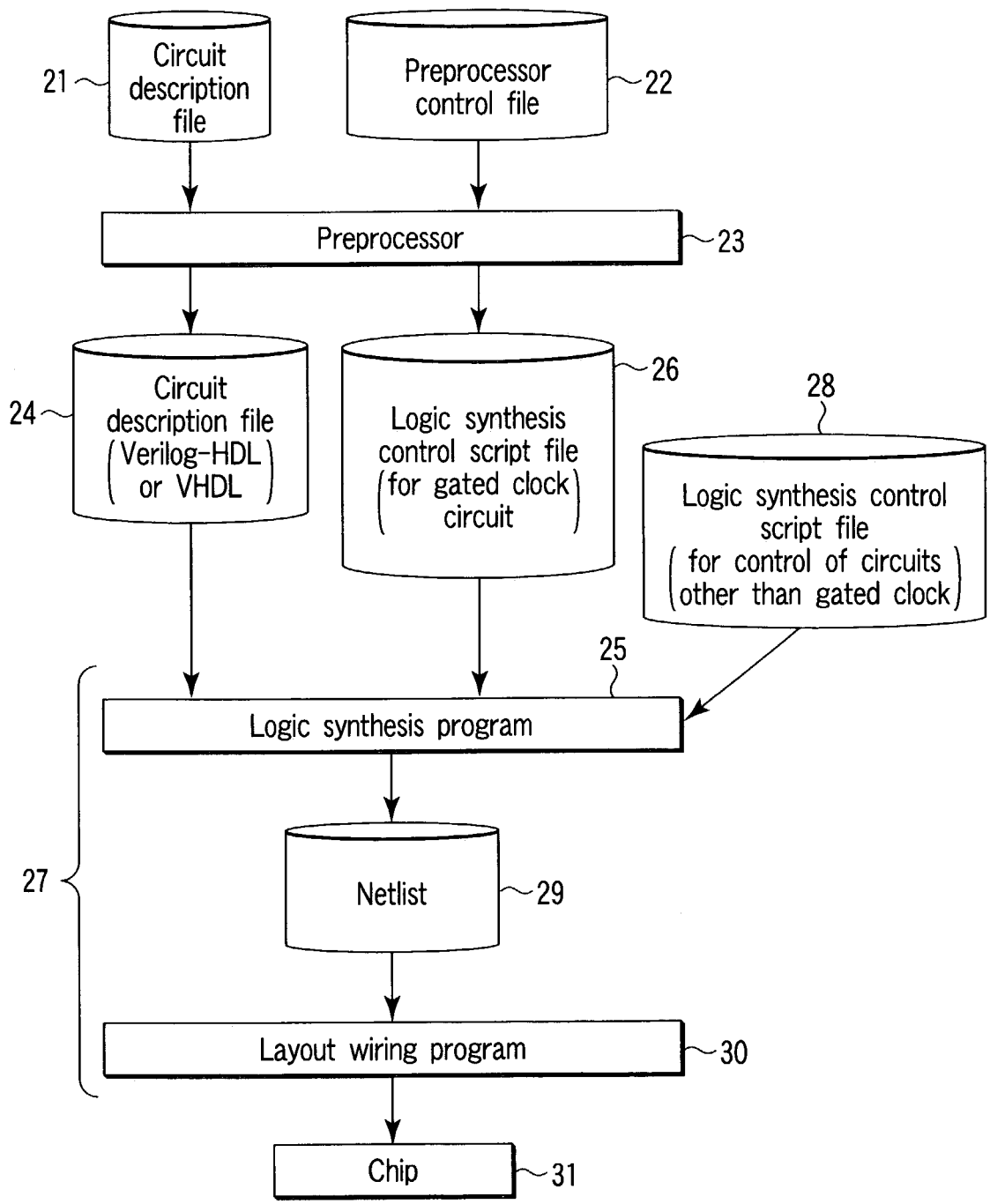
FIG. 2 is a functional block diagram for explaining a preprocessor and integrated circuit design system according to the embodiment of the present invention, which shows the schematic arrangement of the entire system.

FIG. 2 is a functional block diagram for explaining a preprocessor and integrated circuit design system according to the embodiment of the present invention, which shows the schematic arrangement of the entire system. A circuit description file 21 described by a user and a preprocessor control file 22 (a description file which controls the operation of the preprocessor) that is also described by the user are input to a preprocessor 23. Processing for the circuit description file 21 is executed on the basis of the control data of the preprocessor control file 22. The circuit description file 21 contains different hardware description languages (to be referred to as a description language A and description language B herein). The circuit description file 21 also has pieces of information (a) to (f) described.

(a) The name of a reset signal
(b) The name of a clock signal
(c) The flip-flop reset scheme

[synchronous/asynchronous]

(d) Whether a gated clock is to be formed [YES/NO]
(e) If a gated clock is to be formed, whether the description of the clock gating is to be created by the preprocessor Whether the description is to be output in a description format that can be automatically recognized by the automatic gated clock formation function of a logic synthesis program [automatic/created by the preprocessor]

(f) Information (a plurality of pieces of information can be described) about clusters to be regarded as one (combination).

The description language A in the circuit description file 21 is converted into the existing description language B (Verilog-HDL or VHDL) by the preprocessor 23 to generate a circuit description file 24. In addition, a logic synthesis program 25 generates a logic synthesis control script file (for gated clock circuit) 26 to be used for gated clock formation.

In addition to the circuit description file 24 and logic synthesis control script file 26, a logic synthesis script file 28 which is prepared in advance for control of circuits other than gated clocks is input to a logic synthesis tool (computer) 27. In the logic synthesis program 25, processing for converting the circuit description file 24 into a circuit description file using a cell as a basic unit of a circuit is executed. At this time, how to lay out cells and wirings is not determined yet. A netlist (a circuit description using cells output from the logic synthesis program) 29 is created by the logic synthesis program 25.

The netlist 29 is processed by a layout wiring program (a program which lays out cells and wirings) 30 so the layout of cells and wirings is determined. On the basis of the processing result of the layout wiring program 30, the circuit of a chip (semiconductor integrated circuit) 31 is designed.

Figure 3:
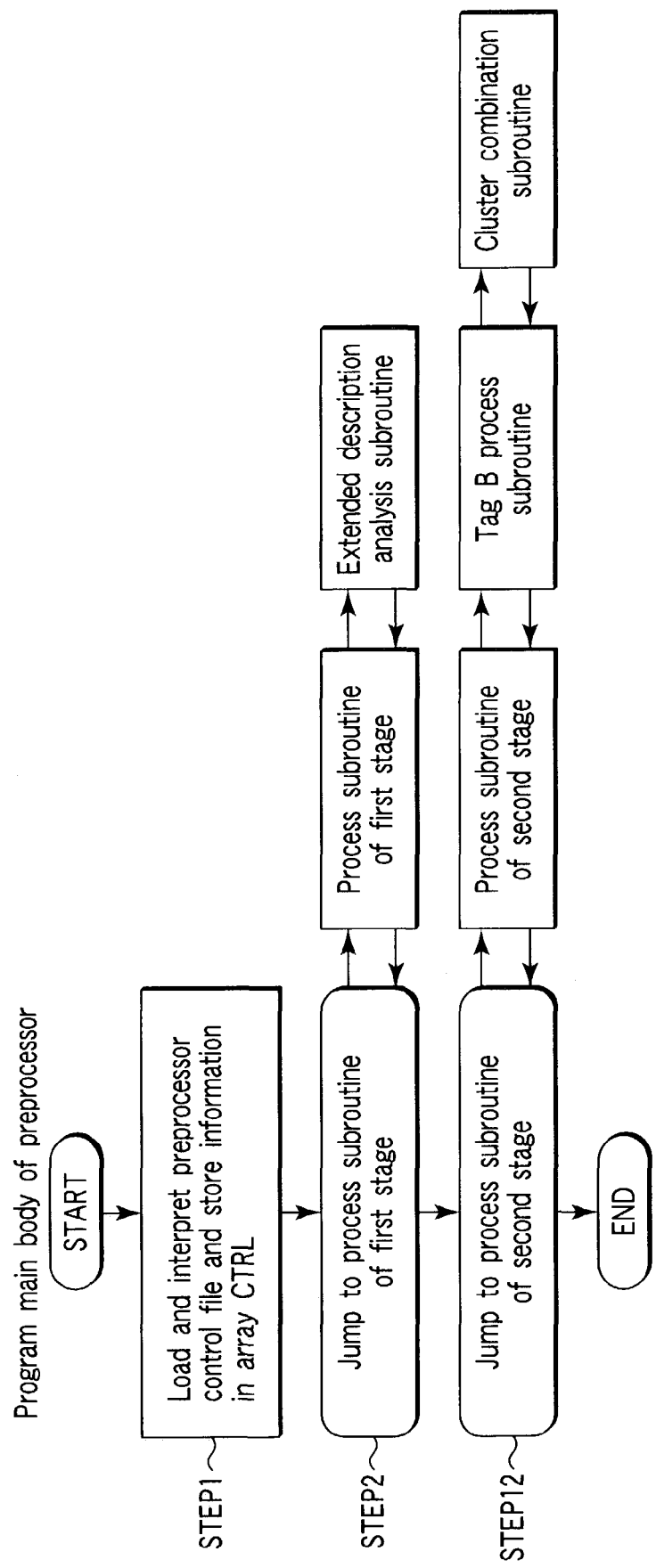
FIG. 3 is a flow chart showing the schematic operation of the preprocessor in the system shown in FIG. 2.
Figure 4:
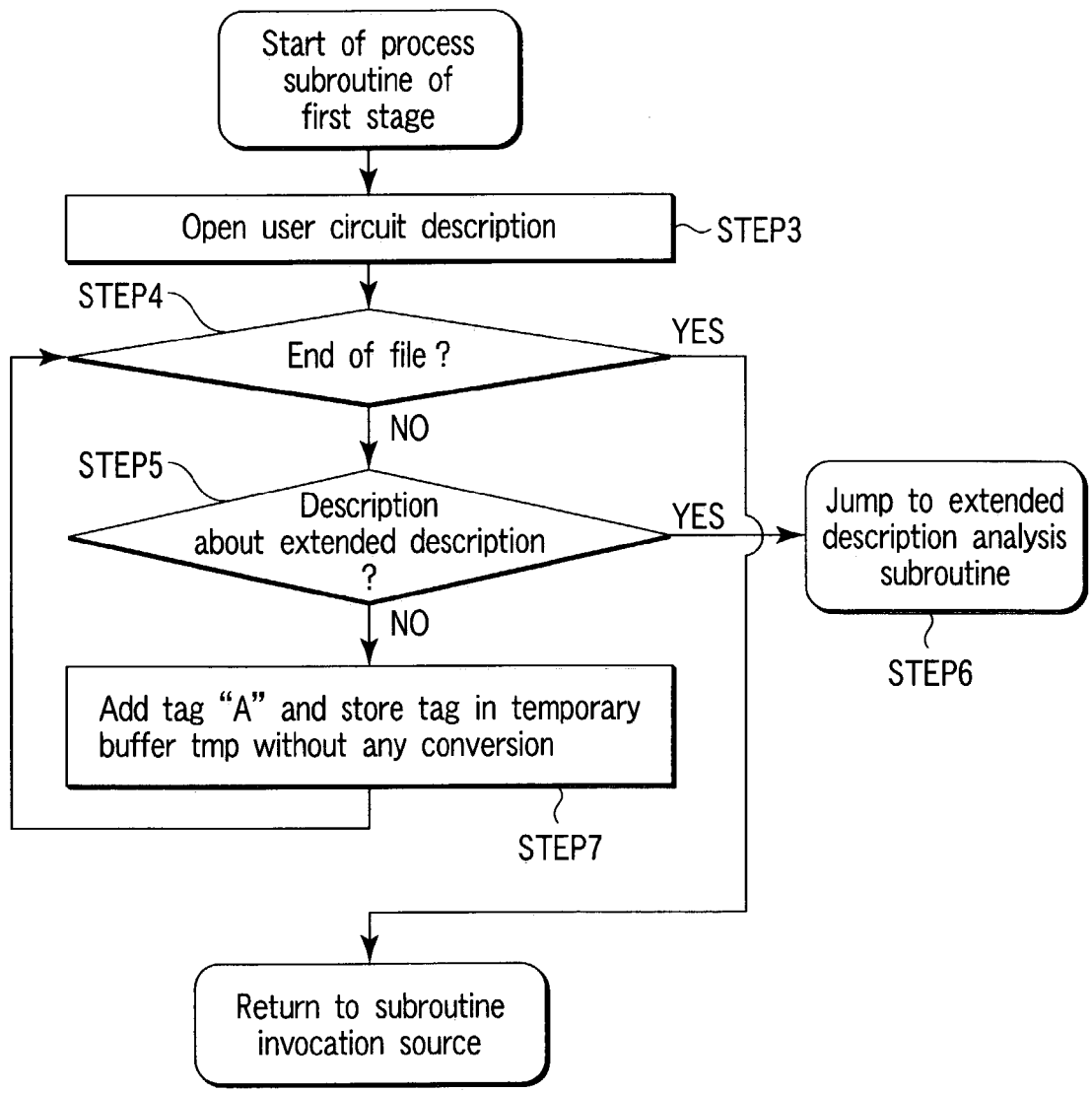
FIG. 4 is a flow chart showing the operation of the preprocessor in the system shown in FIG. 2 and, more particularly, the process subroutine of the first stage in FIG. 3.
Figure 5:
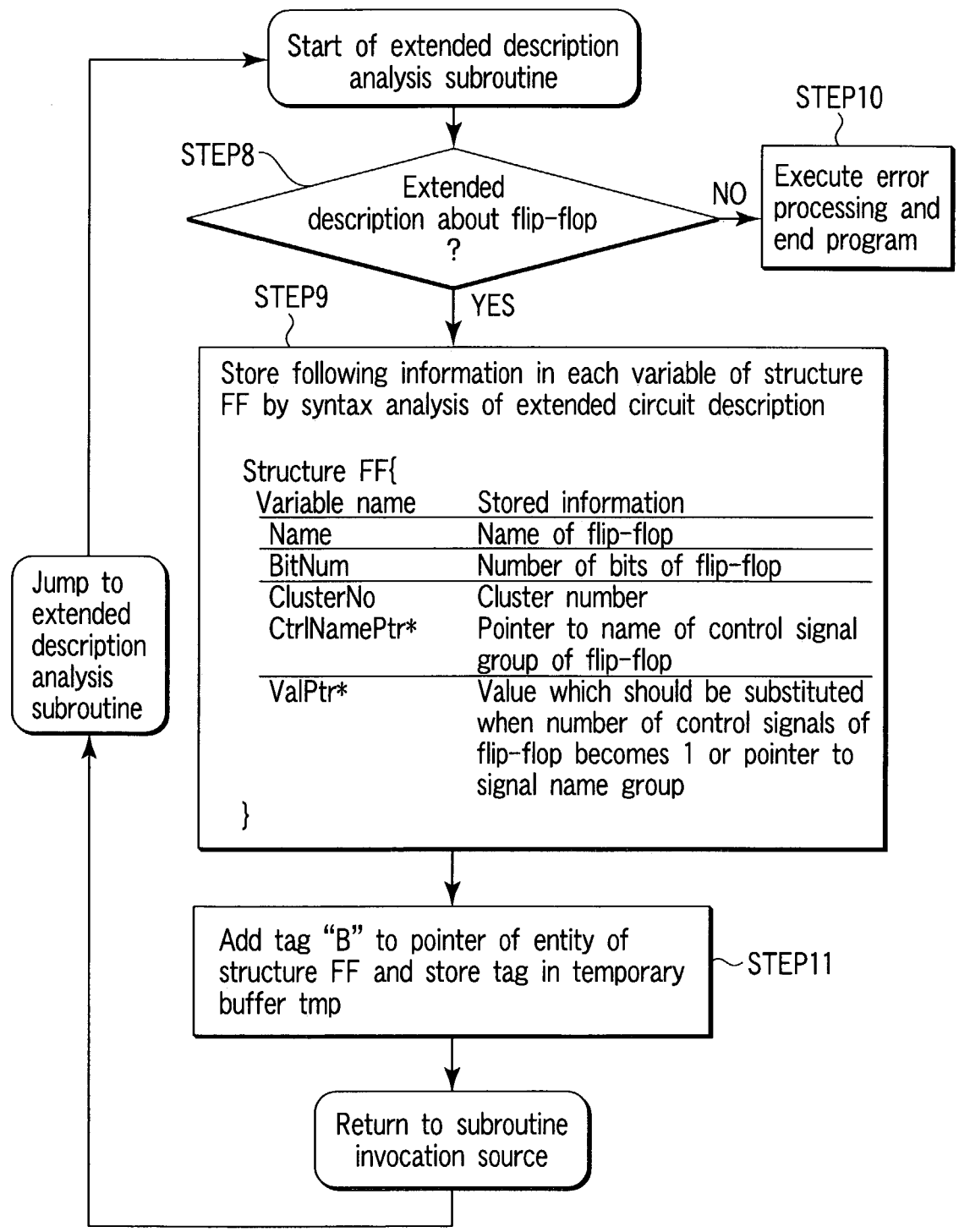
FIG. 5 is a flow chart showing the operation of the preprocessor in the system shown in FIG. 2 and, more particularly, the extended description analysis subroutine in FIG. 3.
Figure 6:
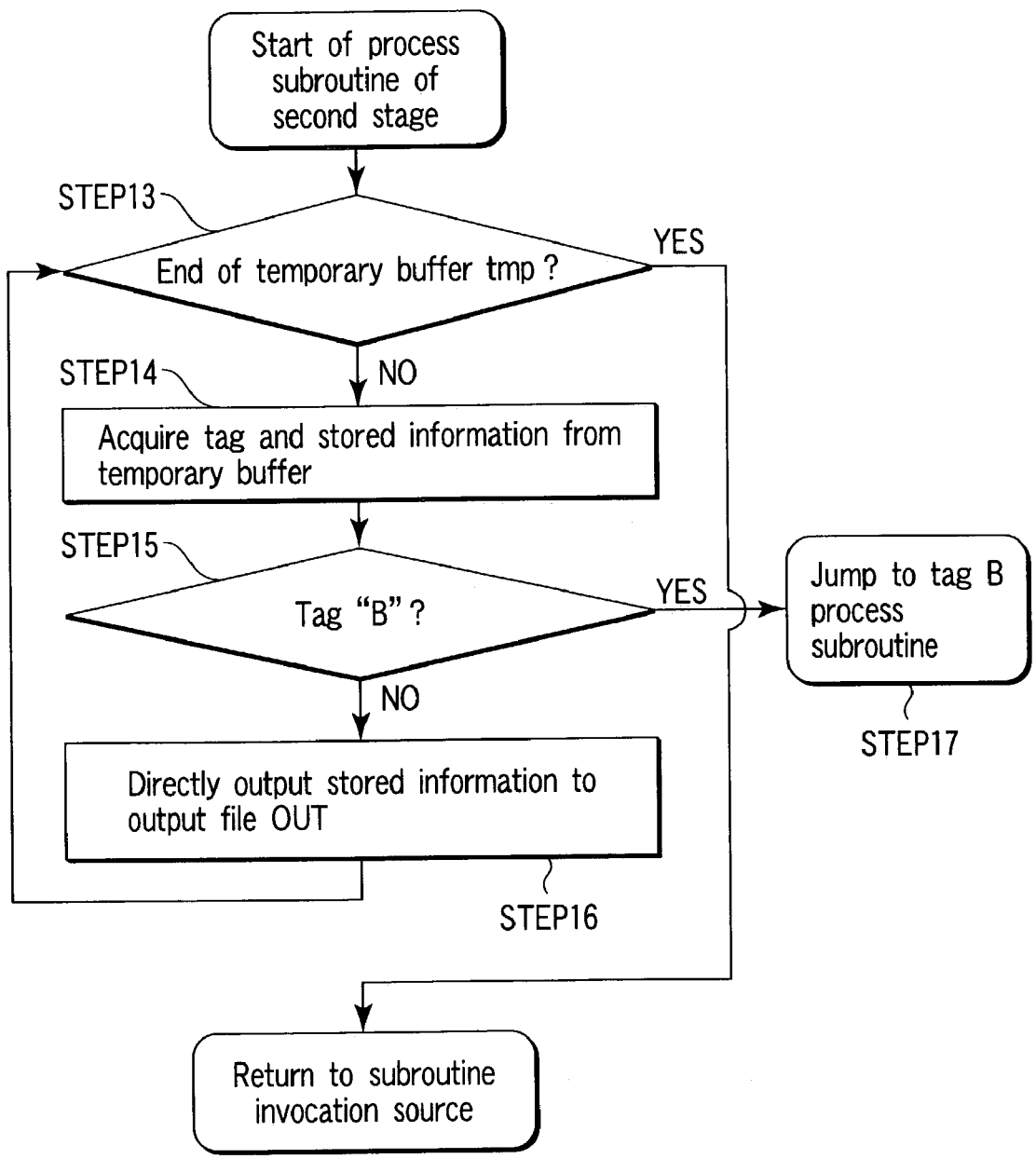
FIG. 6 is a flow chart showing the operation of the preprocessor in the system shown in FIG. 2 and, more particularly, the process subroutine of the second stage in FIG. 3.
Figure 7:
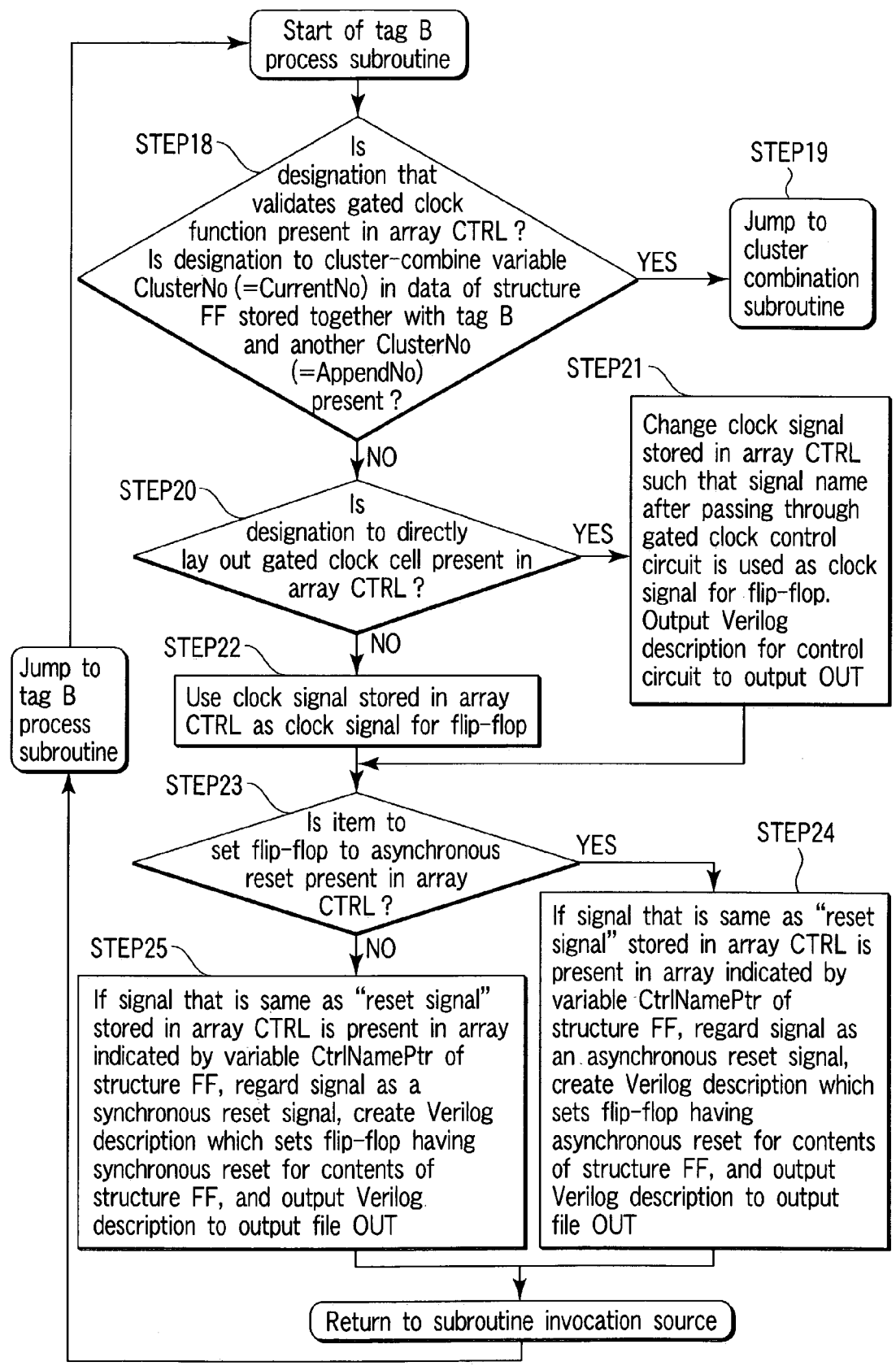
FIG. 7 is a flow chart showing the operation of the preprocessor in the system shown in FIG. 2 and, more particularly, the process subroutine of a tag B in FIG. 3.
Figure 8:
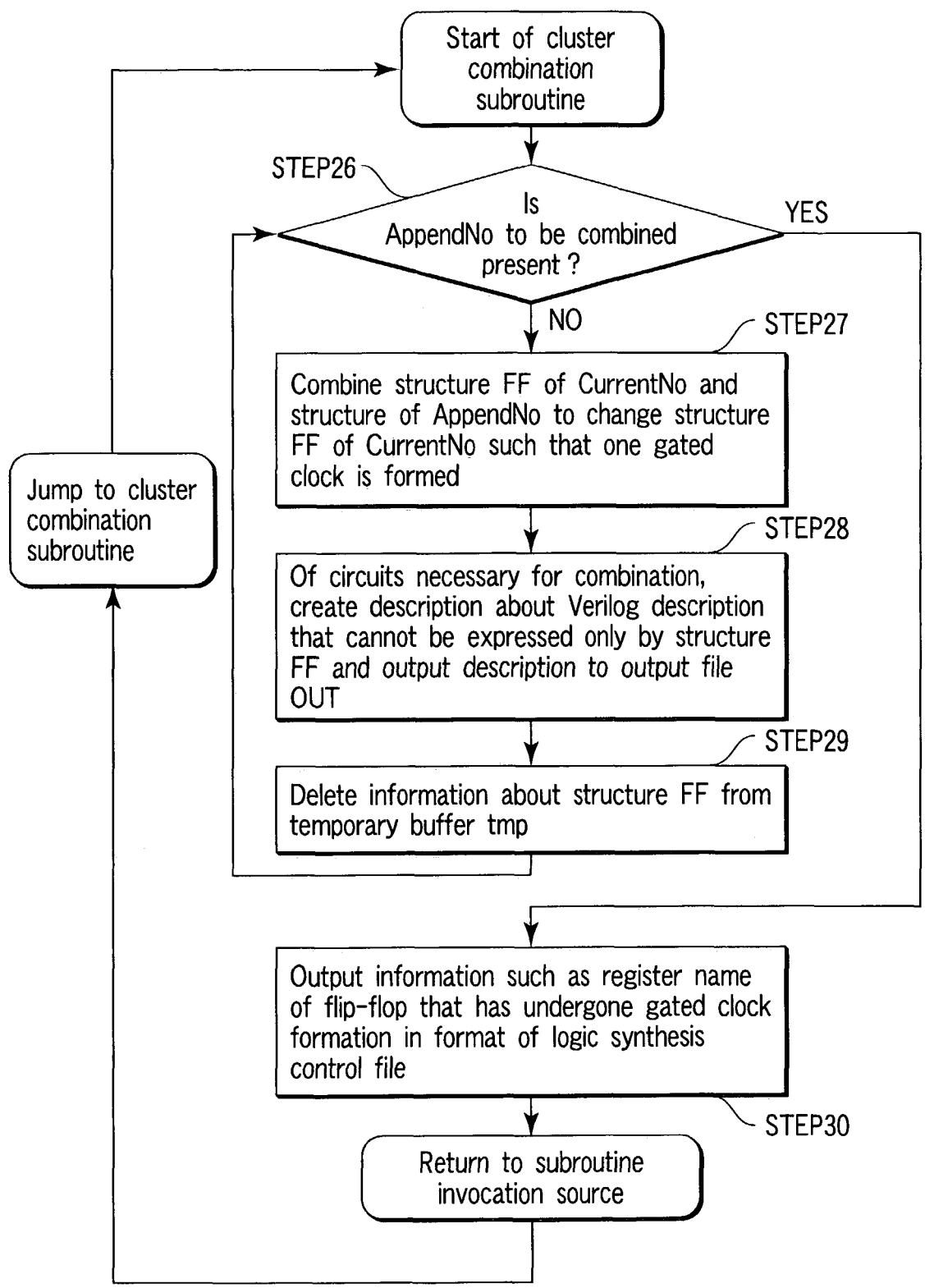
FIG. 8 is a flow chart showing the operation of the preprocessor in the system shown in FIG. 2 and, more particularly, the cluster combination subroutine in FIG. 3.

FIGS. 3 to 8 are flow charts showing the operation of the preprocessor 23 in the integrated circuit design system shown in FIG. 2. FIG. 3 is a flow chart showing the schematic operation of the preprocessor in the system shown in FIG. 2. FIG. 4 is a flow chart showing the process subroutine. FIG. 5 is a flow chart showing the extended description analysis subroutine. FIG. 6 is a flow chart showing the process subroutine of the second stage. FIG. 7 is a flow chart showing the process subroutine of a tag B. FIG. 8 is a flow chart showing the cluster combination subroutine.

As shown in FIG. 3, when the operation of the program main body of the preprocessor 23 starts, the preprocessor control file is loaded and interpreted, and the information is stored in an array CTRL (STEP1).

The flow advances to the process subroutine of the first stage shown in FIG. 4 (STEP2). In the processing of the first stage, the circuit description file 21 by the user is opened (STEP3), and it is determined whether the file is ended (STEP4). If NO in STEP4, it is determined whether the file has a description about an extended description (STEP5). If YES in STEP5, the flow jumps to the extended description analysis subroutine (STEP6). If NO in STEP5, a tag "A" is added and stored in a temporary buffer tmp without any conversion (STEP7). Then, the flow returns to the determination operation in STEP4. The operation in STEP4 to STEP7 is repeated until it is determined that the file is ended. If YES in STEP4, the flow returns to the subroutine invocation source (STEP2).

In the extended description subroutine, it is determined whether it is an extended description about a flip-flop (STEP8), as shown in FIG. 5. If YES in STEP8, pieces of information are stored in the variables of a structure FF by syntax analysis of the extended circuit description (STEP9). If NO in STEP8, error processing is executed, and the program is ended (STEP10). In storing the information in the variables of the structure FF, the name of the flip-flop is stored in Name. The number of bits of the flip-flop is stored in BitNum. The cluster number is stored in ClusterNo. The pointer to the name of control signal group of the flip-flop is stored in CtrlNamePtr*. A value which should be substituted when the number of control signals of the flip-flop becomes 1 or information of the pointer to the signal group is stored in ValPtr*.

The tag "B" is added to the pointer of the entity of the structure FF and stored in the temporary buffer tmp (STEP11).

Then, the flow returns to the subroutine invocation source (STEP5).

When the above-described process subroutine of the first stage is ended, the flow jumps to the process subroutine of the second stage (STEP12). In the process subroutine of the second stage, it is determined first whether the temporary buffer tmp is ended (STEP13), as shown in FIG. 6. If NO in STEP13, the tag and stored information are acquired from the temporary buffer tmp (STEP14). It is determined whether the tag is the tag "B" (STEP15). If NO in STEP15, the stored information is directly output to an output file OUT (STEP16). The flow returns to STEP13 to repeat the same processing as described above. If YES in STEP13, the flow returns to the subroutine invocation source (STEP12). On the other hand, if YES in STEP15, the flow jumps to the process subroutine of the tag "B" (STEP17).

In the process subroutine of the tag "B", as shown in FIG. 7, it is determined whether a designation that validates the gated clock function is present in the array CTRL and whether a designation to cluster-combine the variable ClusterNo (=CurrentNo) in the data of the structure FF stored together with the tag "B" and another ClusterNo (=AppendNo) is present (STEP18). If a cluster combination designation is present, the flow jumps to the cluster combination subroutine (STEP19). If no cluster combination designation is present, it is determined whether a designation to directly lay out a gated clock cell is present in the array CTRL (STEP20). If YES in STEP20, the clock signal stored in the array CTRL is changed such that a signal name after passing through a gated clock control circuit is used as a clock signal for a flip-flop. In addition, a Verilog description for the control circuit is output to the output file OUT (STEP21). If NO in STEP20, the clock signal stored in the array CTRL is used as a clock signal for a flip-flop (STEP22).

It is determined for the processing result in STEP21 and STEP22 whether an item to set the flip-flop to asynchronous reset is present in the array CTRL (STEP23). If YES in STEP23, and a signal that is the same as the "reset signal" stored in the array CTRL is present in an array indicated by the variable CtrlNamePtr of the structure FF, the signal is regarded as an asynchronous reset signal. A Verilog description which sets a flip-flop having asynchronous reset is created for the contents of the structure FF and output to the output file OUT (STEP24). If NO in STEP23, and a signal that is the same as the "reset signal" stored in the array CTRL is present in an array indicated by the variable CtrlNamePtr of the structure FF, the signal is regarded as a synchronous reset signal. A Verilog description which sets a flip-flop having synchronous reset is created for the contents of the structure FF and output to the output file OUT (STEP25). Then, the flow returns to the subroutine invocation source (STEP15).

When the flow jumps to the cluster combination subroutine in STEP19, it is determined whether AppendNo to be combined is present (STEP26), as shown in FIG. 8. If YES in STEP26, the structure FF of the CurrentNo and the structure of AppendNo are combined to change the structure FF of CurrentNo such that one gated clock is formed (STEP27). Next, of circuits necessary for combination, a description about a Verilog description that cannot be expressed only by the structure FF is created and output to the output file OUT (STEP28). After that, information about the Verilog description is deleted from the temporary buffer tmp (STEP29). The flow returns to STEP26. The processing in STEP27 to STEP29 is repeated until the number of AppendNo to be combined becomes 0. When no AppendNo to be combined remains, information such as the register name of the flip-flop that has undergone gated clock formation is output in a format of a logic synthesis control file (STEP30). Next, the flow returns to the subroutine invocation source (STEP18).

Figure 9:
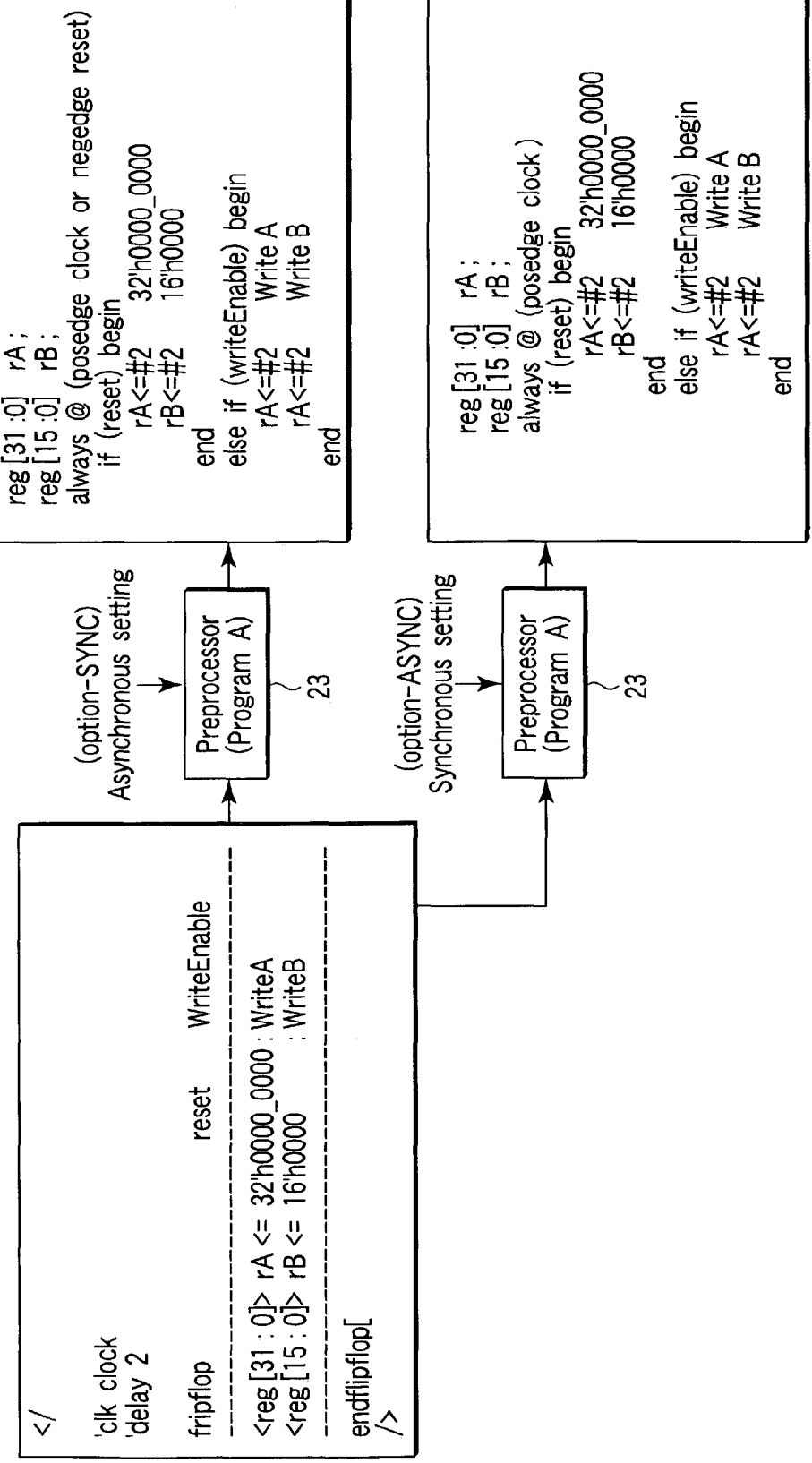
FIG. 9 is a diagram for explaining the relationship between an input and an output when synchronous/asynchronous reset of a flip-flop is changed by the preprocessor shown in FIGS. 3 to 8.

FIG. 9 shows an input file and output file when the synchronous/asynchronous reset designation of a flip-flop is changed by the preprocessor shown in FIGS. 3 to 8. FIG. 9 shows output results of a conversion program A (Program A) when synchronous reset/asynchronous reset is set as the reset scheme of the flip-flop.

Referring to FIG. 9, "</" and "/>" are markers. The description of a portion sandwiched between "</" and "/>" is a conversion object. Here, clk clock designates the name (clock in this example) of a clock signal in the hardware description after conversion, and delay designates the delay value (2 in this example) of simulation in the hardware description after conversion.

In addition, program A means the conversion program A of the preprocessor 23, option-SYNC designates to output, to program A, a hardware description which initializes the flip-flop by a synchronous reset scheme, and option-ASYNC designates to output, to program A, a hardware description which initializes the flip-flop by an asynchronous reset scheme.

In correspondence with the above input file to the preprocessor, a processing result by the conversion program A is output in accordance with the synchronous/asynchronous reset designation of the flip-flop.

In this way, a circuit description file which can freely change the synchronous/asynchronous designation of a flip-flop can be created by the preprocessor 23. In addition, two descriptions about reset of the flip-flop, i.e., a description with "synchronous reset" and a description with "asynchronous reset" can be obtained by executing the conversion program A twice. The description with "synchronous reset" and description with "asynchronous reset" can be obtained in a shorter time as compared to the case wherein the two descriptions are manually generated.

Figure 10:
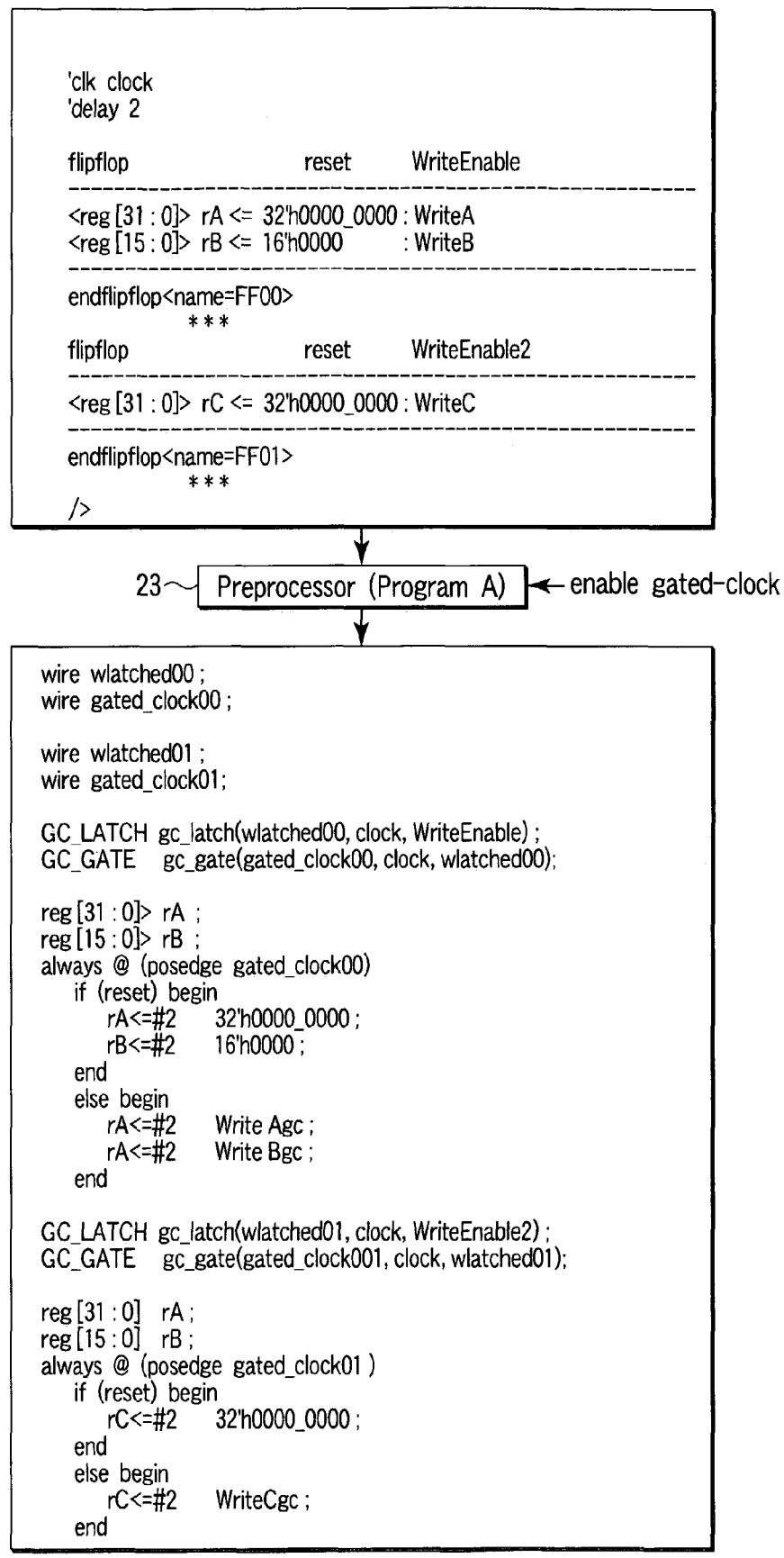
FIG. 10 is a diagram for explaining the relationship between an input file and an output file when the cluster combination function by the preprocessor shown in FIGS. 3 to 8 is not used.
Figure 11:
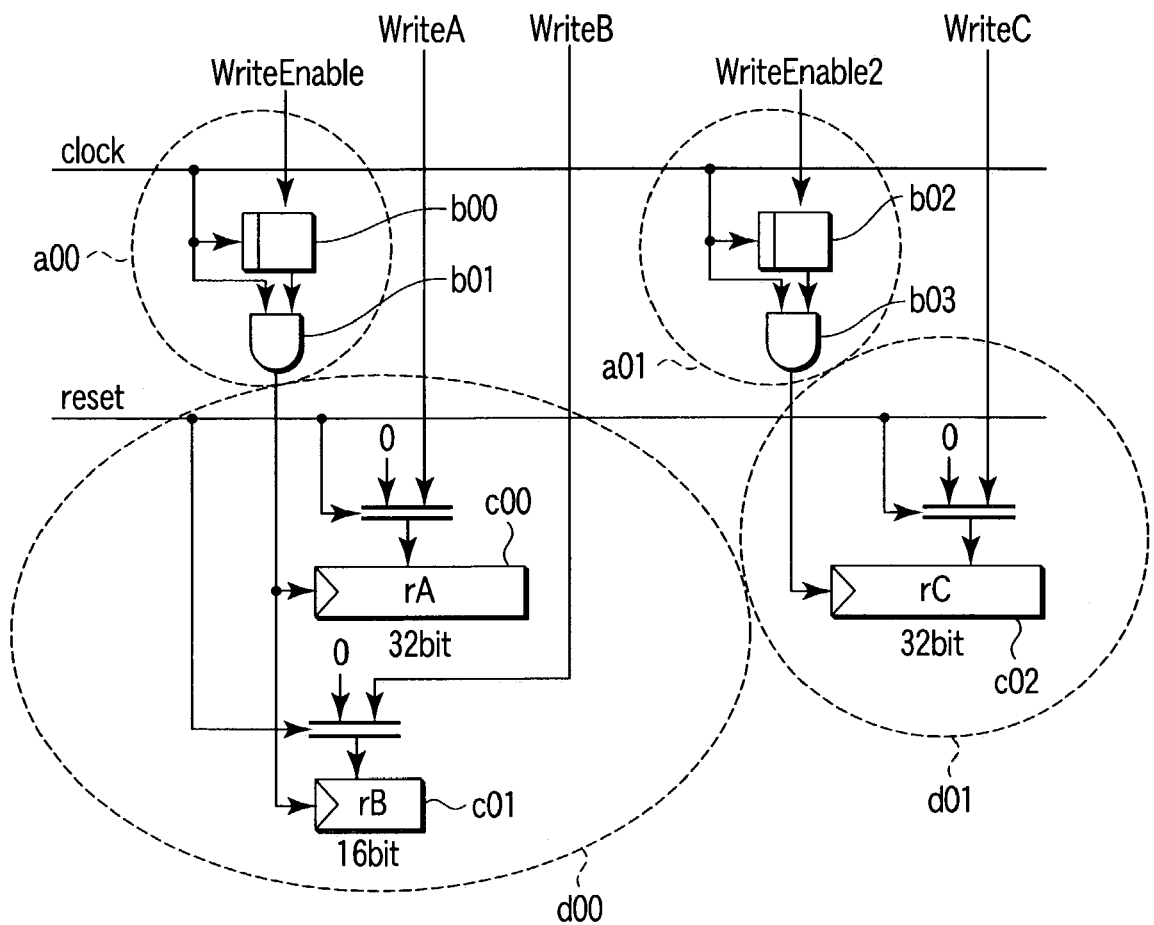
FIG. 11 is a circuit diagram showing the arrangement of a circuit formed using the integrated circuit design system shown in FIG. 2 and without using the cluster combination function by the preprocessor shown in FIGS. 3 to 8.

FIG. 10 shows an example of an input file and output file of the preprocessor (conversion program A) 23 when the gated clock function is used without any grouping designation (when the cluster combination function is not used). FIG. 11 shows an example of a circuit formed from the output file shown in FIG. 10. Referring to FIG. 11, a00 and a01 represent circuits which stop (gating) a clock signal, b00 and b02 represent latches, b01 and b03 represent AND circuits, c00, c01, and c02 represent flip-flops, and d00 and d01 represent clusters.

When a signal enable gate-clock which instructs the gated clock function is input to the preprocessor 23, the input file is processed by the conversion program A, and an output file is created.

Figure 12:
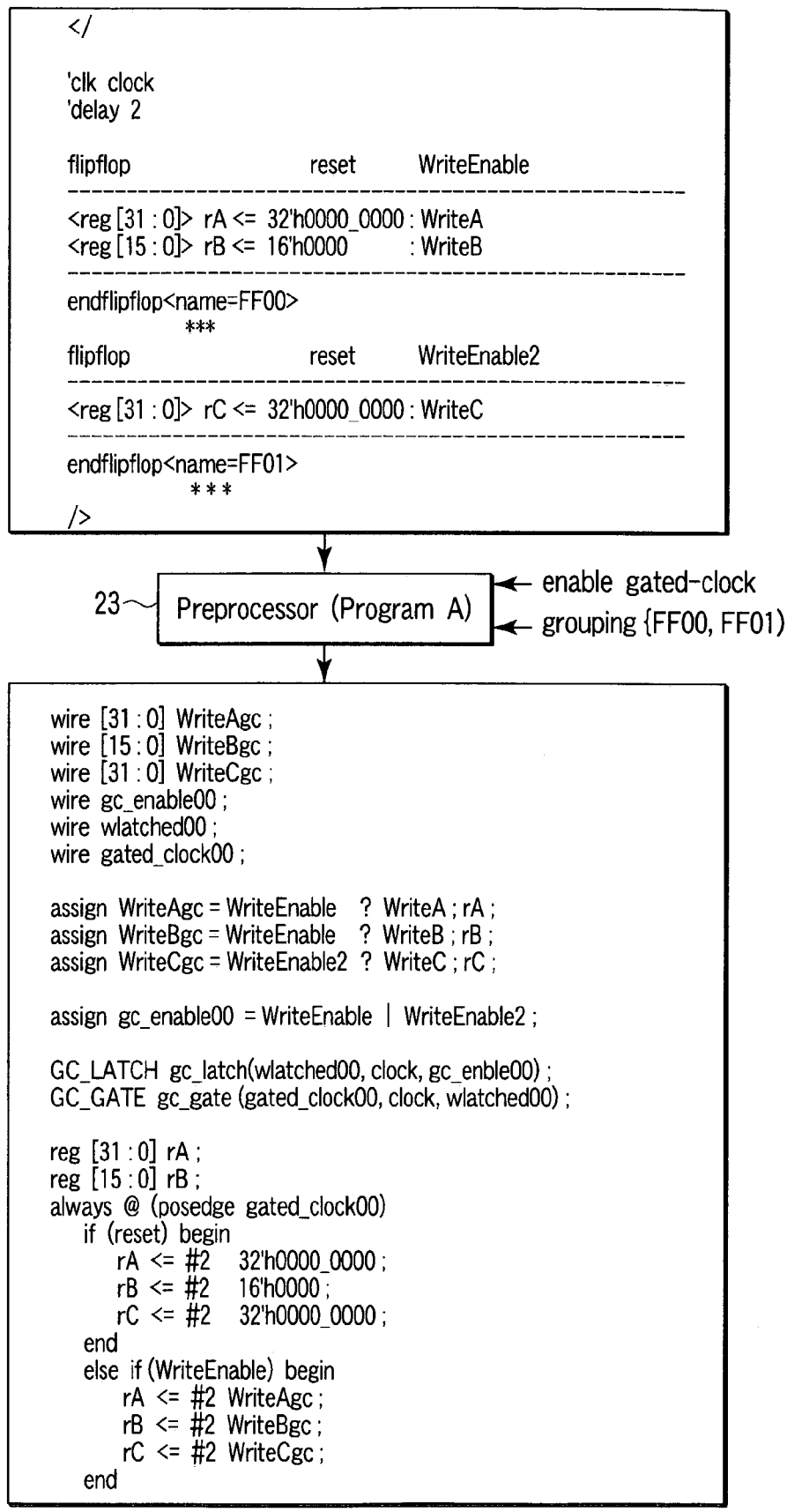
FIG. 12 is a diagram for explaining the relationship between an input file and an output file when the cluster combination function by the preprocessor shown in FIGS. 3 to 8 is used.
Figure 13:
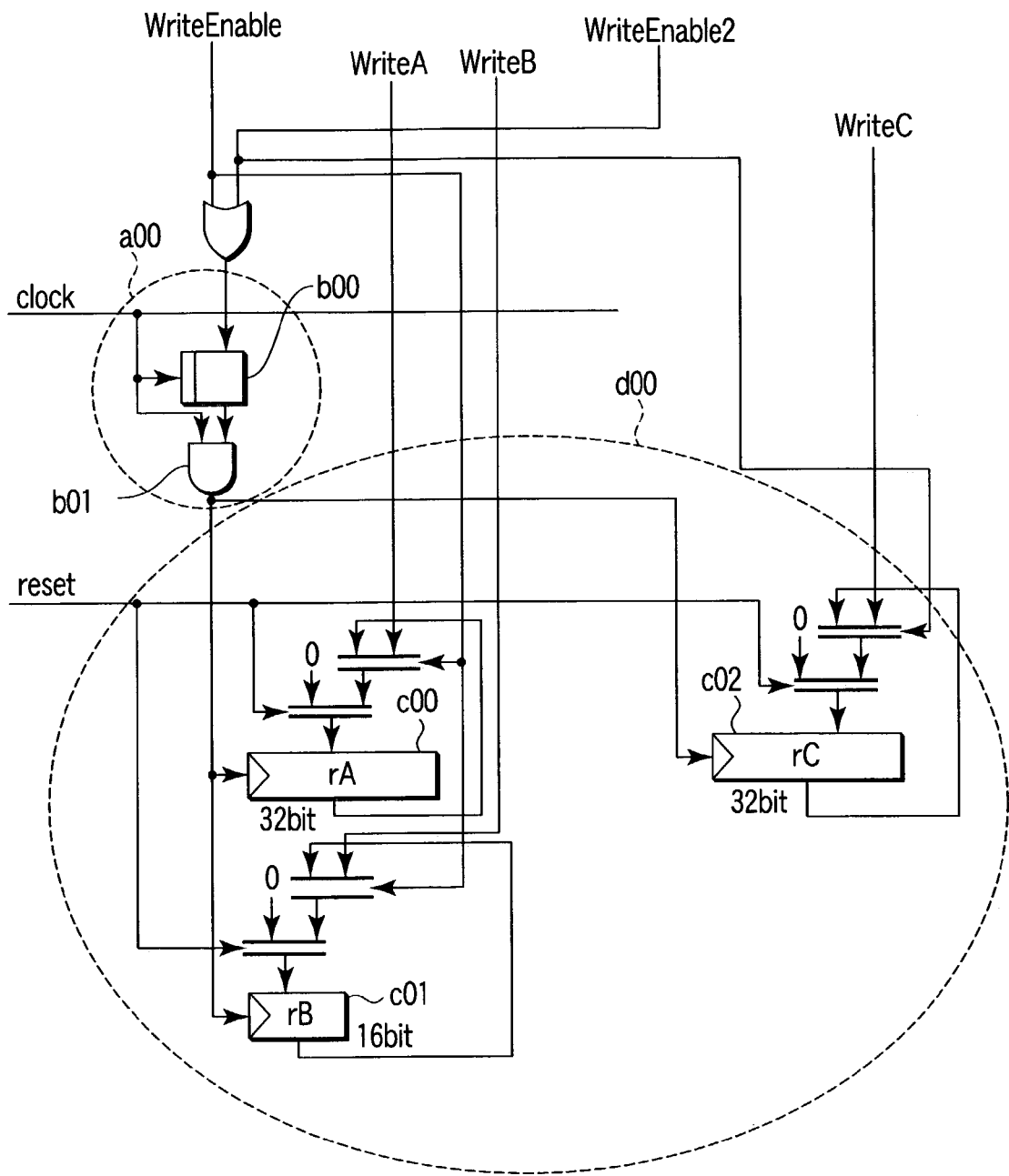
FIG. 13 is a circuit diagram showing the arrangement of a circuit formed using the circuit system shown in FIG. 2 and the cluster combination function by the preprocessor shown in FIGS. 3 to 8.

FIG. 12 shows an example of an input file and output file of the preprocessor (conversion program A) when the gated clock function is used with a grouping designation (when the cluster combination function is used). FIG. 13 shows an example of a circuit formed from the output file shown in FIG. 12. The signal enable gate-clock which instructs the gated clock function and a signal grouping {FF00, FF01} which instructs the cluster combination function are input to the preprocessor 23. Referring to FIG. 13, a00 represents a circuit which stops (gating) a clock signal, b00 represents a latch, b01 represents an AND circuit, c00, c01, and c02 represent flip-flops, and d00 represents a cluster.

As described above, a circuit description file which can change not only the synchronous/asynchronous designation of a flip-flop but also cluster combination of gated clock can be created. In addition, since a larger cluster can easily be implemented by the cluster combination function in gated clock formation for reduction of power consumption, the time required for operation of obtaining the optimum value of cluster size can greatly be shortened.

As described above, in the preprocessor, integrated circuit design system, and integrated circuit design method according to the embodiment of the present invention, the hardware description of a flip-flop is made in a format that does not specify whether the flip-flop is with synchronous reset or a flip-flop with an asynchronous reset. The description about the flip-flop is made using the first hardware description language in a file (first circuit description file) described using an existing hardware description language (second hardware description language). When the circuit description file having the description about the flip-flop embedded is processed by the conversion program A, the description part about the flip-flop is converted into the existing hardware description language and output. At this time, a flip-flop description of synchronous reset scheme can be output in accordance with an argument supplied to the conversion program A. In a similar manner, a flip-flop description of asynchronous reset scheme can also be output.

In this way, when hardware description language conversion is automated using the conversion program A, hardware descriptions described for both the "synchronous reset" scheme and the "asynchronous reset" scheme can easily be obtained. In addition, when the description side of, e.g., "synchronous reset" scheme is verified, the description of "asynchronous reset" scheme is also verified. Hence, the time required for verification of two hardware descriptions can be halved. Accordingly, the development period of LSIs and the like can also be shortened.

Furthermore, a designation to use a gated clock as the clock of the flip-flop can be designated for the conversion program A. In this case, a description with clock gating of the flip-flop is created. Moreover, when a description X and a description Y are present for the flip-flop, a clock can be shared by the descriptions X and Y, and gated clock formation can be executed for the shared clock (cluster combination).

As described above, RTL descriptions corresponding to various configurations can easily be obtained.

Hence, according to the above-described arrangement and design method, a circuit description file which can change the synchronous/asynchronous designation of a flip-flop and the cluster combination of a gated clock can be created by the preprocessor 23. For this reason, the development period can be shortened, and the cost can be reduced. In manual operation, correction must be performed because of bugs, and function verification operation must be executed every time a circuit is corrected. With the automation, the verification operation is unnecessary. The development period can be shortened, and the cost can be reduced even from this viewpoint.

In the above embodiment, the circuit description file 21 and preprocessor control file 22 have been described as separate files for the descriptive convenience. However, the files may be integrated into one file, as a matter of course.

As described above, according to one aspect of this invention, a preprocessor which can create a circuit description file capable of changing the synchronous/asynchronous designation of a flip-flop and the cluster combination of gated clock can be obtained.

In addition, an integrated circuit design system which can shorten the development period and reduce the cost and an integrated circuit design method by this system can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A preprocessor, wherein a first circuit description file including a first hardware description language and a second hardware description language is processed on the basis of a preprocessor control file, and at least a portion described by the first hardware description language in the first circuit description file is converted into the second hardware description language to create and output a second circuit description file,
wherein a logic synthesis control script file for a gated clock circuit is further created and output on the basis of the preprocessor control file and the first circuit description file.

2. A preprocessor according to claim 1, wherein the second hardware description language includes one of Verilog-HDL and VHDL.

3. A preprocessor according to claim 1, wherein the processing of the first circuit description file is processing of extracting the first hardware description language from the first circuit description file, converting the first hardware description language into the second hardware description language, and outputting the second circuit description file without converting a portion described by the second hardware description language in the first circuit description file.

4. A preprocessor according to claim 1, wherein the first circuit description file includes a description about a flip-flop, which is described by the first hardware description language, and information corresponding to a circuit obtained by forming a gated clock of the description about the flip-flop is converted into the second hardware description language and output.

5. A preprocessor according to claim 4, wherein the description about the flip-flop, which is made by the first hardware description language, is made without specifying a reset scheme of the flip-flop, and whether the flip-flop should use a synchronous reset scheme or an asynchronous reset scheme is designated in converting at least the portion described by the first hardware description language in the first circuit description file into the second hardware description language.

6. A preprocessor according to claim 4, wherein in the description about the flip-flop, one cluster number is assigned to one flip-flop description.

7. A preprocessor according to claim 4, wherein the second circuit description file is obtained by converting descriptions of flip-flops indicated by a plurality of cluster numbers into a description of a flip-flop to be driven by one gated clock signal.

8. An integrated circuit design system comprising:
a preprocessor which processes a first circuit description file including a description of a flip-flop described by a first hardware description language on the basis of a preprocessor control file, creates a second circuit description file by converting at least the description of the flip-flop into a second hardware description language, and creates a logic synthesis control script file for a gated clock circuit; and
a logic synthesis tool which subjects the second circuit description file to logical synthesis using logic synthesis control script file created by the preprocessor and converts the files into a circuit description file using a cell as a basic unit of a circuit to create a netlist and determine a layout of cells and wirings in an integrated circuit on the basis of the netlist.

9. A system according to claim 8, wherein the netlist is created by logically synthesizing, in addition to the second circuit description file and logic synthesis control script file, a logic synthesis control script file for control other than a gated clock.

10. A system according to claim 8, wherein information for gated clock formation of the flip-flop is created by logic synthesis by a logic synthesis tool.

11. A system according to claim 8, wherein the description about the flip-flop, which is made by the first hardware description language, is made without specifying a reset scheme of the flip-flop, and whether the flip-flop should use a synchronous reset scheme or an asynchronous reset scheme is designated in converting at least the portion described by the first hardware description language in the first circuit description file into the second hardware description language.

12. A system according to claim 8, wherein in the description about the flip-flop, one cluster number is assigned to one flip-flop description.

13. A system according to claim 8, wherein the second circuit description file is obtained by converting descriptions of flip-flops indicated by a plurality of cluster numbers into a description of a flip-flop to be driven by one gated clock signal.

14. An integrated circuit design method comprising:
inputting, to a preprocessor, a circuit description file including a first hardware description language and a second hardware description language and a preprocessor control file which controls operation of the preprocessor and converting at least a portion described by the first hardware description language in the circuit description file into the second hardware description language;
logically synthesizing a circuit description file output from the preprocessor using a logic synthesis control script file for a gated clock circuit and a logic synthesis control script file for circuits other than the gated clock circuit by a logic synthesis tool to convert the files into a circuit description file using a cell as a basic unit of a circuit and create a netlist; and
determining the layout of the cells and the wirings on the basis of the netlist to design a circuit of a chip.

15. A method according to claim 14, wherein the circuit description file includes a description about a flip-flop, which is made by the first hardware description language, and a synchronous/asynchronous designation and cluster combination of a gated clock are changed by the preprocessor.

16. A method according to claim 15, wherein the preprocessor control file contains at least one of pieces of information representing a name of a reset signal, a name of a clock signal, a flip-flop reset scheme, whether a gated clock is to be formed, if the gated clock is to be formed, whether a description of clock gating is to be created by the preprocessor, whether the description is to be output in a description format that can be automatically recognized by an automatic gated clock formation function of a logic synthesis program, and information about clusters to be regarded as one.

17. A method according to claim 14, wherein converting at least the portion described by the first hardware description language in the circuit description file into the second hardware description language comprises
loading and interpreting the preprocessor control file and storing the interpreted information in the preprocessor,
determining whether the information stored in the preprocessor is related to an extended description, and if the information is related to the extended description, analyzing the extended description,
determining a tag when it is determined that the information is not related to the extended description,
determining a cluster combination designation when it is determined that the tag is a predetermined tag,
designating whether the flip-flop should use synchronous reset or asynchronous reset and creating a circuit description corresponding to the flip-flop of synchronous reset or a circuit description corresponding to the flip-flop of asynchronous reset, and
creating information necessary for cluster combination when the cluster combination designation is present.

18. A method according to claim 17, wherein analyzing the extended description comprises
determining whether the extended description is an extended description about the flip-flop,
storing information in each variable of a structure flip-flop when it is determined in the determination that the extended description is the extended description about the flip-flop, and
adding a tag to a pointer to an entity of the structure flip-flop and storing the tag in a temporary buffer.

19. A method according to claim 17, wherein determining the tag comprises
acquiring the tag and stored information from the temporary buffer, and
determining whether the tag is the predetermined tag, and when the tag is not the predetermined tag, directly outputting the stored information to an output file.

* * * * *